United States Patent
Han et al.

(10) Patent No.: US 7,272,050 B2
(45) Date of Patent: Sep. 18, 2007

(54) NON-VOLATILE MEMORY DEVICE AND ERASE METHOD OF THE SAME

(75) Inventors: Eui-Gyu Han, Gyeonggi-do (KR); Kil-Yeon Kim, Gyeonggi-do (KR); Gyeong-Soo Han, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 11/060,915

(22) Filed: Feb. 17, 2005

(65) Prior Publication Data

US 2006/0034128 A1 Feb. 16, 2006

(30) Foreign Application Priority Data

Aug. 10, 2004 (KR) .................. 10-2004-0062825
Sep. 22, 2004 (KR) .................. 10-2004-0076030

(51) Int. Cl.
*G11C 11/34* (2006.01)
*G11C 16/06* (2006.01)

(52) U.S. Cl. ...................... 365/185.22; 365/185.24; 365/185.27; 365/185.29

(58) Field of Classification Search ........... 365/185.22, 365/185.29, 185.24, 185.27
See application file for complete search history.

(56) References Cited

U.S. PATENT DOCUMENTS 5,299,162 A 3/1994 Kim et al.
5,361,227 A 11/1994 Tanaka et al.
6,009,014 A 12/1999 Hollmer et al.
6,282,121 B1 8/2001 Cho et al.
6,483,752 B2 * 11/2002 Hirano .................. 365/185.33
6,496,412 B1 * 12/2002 Shibata et al. ......... 365/185.03
2002/0057599 A1 * 5/2002 Miyawaki et al. ...... 365/185.22
2003/0067818 A1 * 4/2003 Hirano ....................... 365/200
2003/0206438 A1 * 11/2003 Shibata et al. ......... 365/185.09

FOREIGN PATENT DOCUMENTS

KR 2001-3657 1/2001
KR 2001-7106 1/2001

OTHER PUBLICATIONS

English language abstract of Korean Publication No. 2001-3657.
English language abstract of Korean Publication No. 2001-7106.
Samsung Electronics Co., Ltd., "(NAND) Flash Memory & Smart Media Databook", Sep. 2003, 2 pp.

* cited by examiner

*Primary Examiner*—Anh Phung
*Assistant Examiner*—Toan Le
(74) *Attorney, Agent, or Firm*—Marger Johnson & McCollom, P.C.

(57) ABSTRACT

An erase method of a non-volatile memory device including memory cells arranged in a matrix of rows and columns. The memory cells are erased at the same time. An erase-verify operation is performed for the erased memory cells. The erase method is repeated under different bias conditions of the rows. An erase-verify operation is successively performed twice or more under different bias conditions of wordlines to decrease cell current caused by a weak cell which may be produced in a process. Thus, a reliability of an erase-verify operation is enhance to increase a yield.

31 Claims, 7 Drawing Sheets

NON-VOLATILE MEMORY DEVICE AND ERASE METHOD OF THE SAME

PRIORITY STATEMENT

This application claims priority of Korean Patent Application No. 2004-62825, filed on Aug. 10, 2004, and No. 2004-76030, filed on Sep. 22, 2004 in the Korean Intellectual Property Office, the disclosure of which is incorporated herein in its entirety by reference.

BACKGROUND OF THE INVENTION

1. Field of the Invention

The invention relates to a non-volatile memory device and, more particularly, to an erase method of a non-volatile memory device.

2. Description of Related Art

Generally, semiconductor memory devices to store data are classified into volatile memory devices such as DRAM and SRAM, and non-volatile memory devices such as PROM, EPROM, MRAM, FRAM, and flash EEPROM. The volatile memory devices lose their stored data when their power supplies are interrupted, while the non-volatile memory devices continuously hold their stored data even when their power supplies are interrupted. Therefore, non-volatile memory devices such as flash EEPROMs (hereinafter referred to as "flash memory devices") are widely used as data storages for various applications such as computer systems whose power supplies have a possibility to be interrupted.

A NAND flash memory device includes electrically erasable and programmable read-only memory cells, which are called "flash EEPROM cells". A typical flash EEPROM cell has a cell transistor that includes a first conduction-type (e.g., P-type) semiconductor substrate (or bulk), second conduction-type (e.g., N-type) source and drain regions spaced apart from each other, a floating gate disposed over a channel region between the source and drain regions to store charges, and a control gate disposed on the floating gate. An array of a NAND flash memory device having such a cell transistor is illustrated in FIG. 1. The array of the NAND flash memory device includes a plurality of cell strings (or NAND strings). In FIG. 1, only one of the cell strings is shown.

A cell string includes a string select transistor SST being a first select transistor, a ground select transistor GST being a second select transistor, and a plurality of memory cells MC0-MCm being serially coupled between the select transistors SST and GST. The string select transistor SST has a drain coupled to a corresponding bitline BL and a gate connected to a string select line SSL. The ground select transistor GST has a source connected to a common source line CSL and a gate connected to a ground select line GSL. Memory cells MCm-MC0 (m=31) are serially coupled between a source of the string select transistor SSL and a drain of the ground select transistor GSL. The memory cells MCm-MC0 are connected to corresponding wordlines WLm-WL0, respectively. A bitline BL is connected to a page buffer PB.

As being well known to those skilled in the art, a group of cell strings illustrated in FIG. 1 is called a memory block. In a NAND flash memory device, program and read operations are performed per page and an erase operation is performed per block. Generally, an erase procedure is followed by a program operation to erase memory cells. As illustrated in FIG. 2, an erase procedure comprises performing an erase operation (S10) and performing an erase-verify operation (S20). In the step S10, memory cells of a memory block are erased at the same time. The memory cells are erased by, for example, applying a voltage of 0V to wordlines WL0-WL31 and a high voltage (e.g., 20V) to a substrate (or bulk). That is, electrons of floating gates are emitted to a substrate to make a threshold voltage lower to an erase threshold voltage of −1V~−3V. In the step S20, it is judged weather threshold voltages of the erased memory cells are lower than erase threshold voltage (or target threshold voltage; for example, −1V). The steps S10 and S20 are repeated within the number of determined erase cycles until all memory cells are sufficiently erased.

A conventional erase-verify operation will now be described with reference to a timing diagram of FIG. 3. Roughly, a conventional erase-verify operation includes a bitline discharge period T0, a bitline precharge period T1, a sense period T2, and a recovery period T3. In the bitline discharge period T0, a voltage of a bitline BL is discharged to a ground voltage through a page buffer PB shown in FIG. 1. In the bitline precharge period T1, the bitline BL is precharged to a predetermined voltage through the page buffer PB. In the sense period T2, it is sensed whether cell current flows through a cell string. For example, during the sense period, sensing current is supplied from the page buffer PB to the bitline BL, while a voltage of 0V is applied to all wordlines WL0-WL31. At this time, a read voltage Vread is applied to a string select line SSL and a ground select line GSL. According to the above bias condition, sensing current supplied to the bitline BL is discharged to a common source line CSL through a cell string when threshold voltages of all memory cells reach or are lower than an erase threshold voltage. The page buffer PB senses a voltage level of a bitline BL and latches data '1', as a sensing result, indicating that all memory cells of a cell string are sufficiently erased. Latch values corresponding to cell strings of a memory block are transmitted to a pass/fail check circuit (see FIG. 4). In the recovery period T3, voltages of wordlines, bitlines, and select lines are initialized to 0V.

The above-described erase-verify method is disclosed in U.S. Pat. No. 6,009,014 entitled "ERASE VERIFY SCHEME FOR NAND FLASH".

As an operating voltage (or power supply voltage) drops, conventional erase-verify methods encounter the following problems. As described above, a sensing operation is performed while a voltage of 0V is applied to control gates of all memory cells of a cell string (or all wordlines). According to the above erase-verify method, although a memory cell is judged as an erased cell during a normal read operation, a cell string having such a memory cell (e.g., a weak well which may be produced in a process) causes an erase failure during an erase-verify operation. That is, in case of a low voltage NAND flash memory device using the foregoing erase-verify method, a low voltage margin becomes poor and thus a cell judged as an erase cell during a normal read operation causes an erase failure during an erase-verify operation.

SUMMARY OF THE INVENTION

Exemplary embodiments of the invention are directed to an enhanced erase scheme.

Exemplary embodiments of the invention are directed to an erase scheme to prevent a sufficiently erased cell from causing an erase failure, and a non-volatile memory device using the erase scheme.

In an exemplary embodiment, there is provided an erase method of a non-volatile memory device including memory cells arranged in a matrix of rows and columns. The erase method comprises erasing the memory cells at the same time; and performing an erase-verify operation for the erased memory cells. The erase-verify operation is repeated under different bias conditions of the rows.

In some embodiments, the erase-verify operation includes a first erase-verify operation and a second erase-verify operation which are sequentially performed.

In some embodiments, the first erase-verify operation is performed under a first bias condition in which a first read voltage is applied to a part of the rows and a second read voltage is applied to the other rows. The second erase-verify operation is performed under a second bias condition in which the second read voltage is applied to the part of the rows and the first read voltage is applied to the other rows.

In some embodiments, the first read voltage is 0V and the second read voltage is 5V.

In some embodiments, the erasing method steps are repeated within the number of predetermined erase cycles according to results of the first and second erase-verify operation. A combination of the results of the first and second erase-verify operations is stored in a status register of the non-volatile memory device. The value stored in the status register is output externally by a state read operation.

In some embodiments, the non-volatile memory device is a NAND flash memory device.

In an exemplary embodiment, there is provided an erase method of a non-volatile memory device including a plurality of cell strings each having a first select transistor connected to a string select line, a second select transistor connected to a ground select line, and memory cells being serially coupled between the first and second select transistors and each being connected to corresponding wordlines. The erase method comprises erasing the memory cells at the same time; performing a first erase-verify operation while a first read voltage is applied to a part of the wordlines and a second read voltage higher than the first read is applied to the other wordlines; performing a second erase-verify operation while the second read voltage is applied to the part of the wordlines and the first read voltage is applied to the other wordlines.

In some embodiments, the first read voltage is 0V and the second read voltage is 5V.

In some embodiments, the erasing method steps are repeated within the number of predetermined erase cycles according to results of the first and second erase-verify operation. The second read voltage is applied to the string and ground select lines in the after erasing all of the memory cells.

In an exemplary embodiment, there is provided an erase method of a non-volatile memory device including a plurality of cell strings each having a first select transistor connected to a string select line, a second select transistor connected to a ground select line, and memory cells being serially coupled between the first and second select transistors and each being connected to corresponding wordlines. The erase method comprises performing a first erase-verify operation while a first read voltage is applied to first ones of the wordlines and a second read voltage higher than the first read is applied to second ones of the wordlines; performing a second erase-verify operation while the second read voltage is applied to the first wordlines and the first read voltage is applied to the other wordlines; and judging an erase operation for the memory cells according to results of the first and second erase-verify operations.

In an exemplary embodiment, there is provided a non-volatile memory device. The non-volatile memory device comprises a string select line connected to a string select transistor, a ground select line connected to a ground select transistor, wordlines connected to memory cells and divided into at least two groups, a row decoder circuit configured to control the wordlines and select lines, and an erase controller to control the row decoder circuit so that the first group of the wordlines are set to a different bias condition from the second group of the wordlines in respective first and second erase-verify operations.

In some embodiments, the first erase-verify operation is performed under a first bias condition in which a first read voltage is applied to the first group of the wordlines and a second read voltage is applied to the second group of the wordlines. The second erase-verify operation is performed under a second bias condition in which the second read voltage is applied to the second group of the wordlines and the first read voltage is applied to the first group of the wordlines. The second read voltage is applied to the string and ground select lines in the first and second erase-verify operations.

In some embodiments, the first read voltage is 0V and the second read voltage is 5V.

In some embodiments, the erase controller includes a status register in which a combination of results of the first and second erase-verify operation is stored. The value stored in the status register is output externally by a state read operation.

In an exemplary embodiment, there is provided an erase method of a non-volatile memory device including a plurality of cell strings each having a first select transistor connected to a string select line, a second select transistor connected to a ground select line, and memory cells being serially coupled between the first and second select transistors and each being connected to corresponding wordlines. The erase method comprises applying a first voltage to a gate of the first select transistor; applying the first voltage to a gate of the second select transistor; supplying sensing current to a drain of the first select transistor; and applying a higher voltage (e.g., 0.2V~0.3V) than 0V to a control gate of respective memory cells connected in series.

In some embodiments, the first voltage is 5V.

DETAILED DESCRIPTION OF THE INVENTION

Although voltage values throughout this disclosure are given as a particular value, it should be understood that this value may represent a range of values. Further, the term "approximately" is intended to explicitly convey this understanding.

Figure 1:
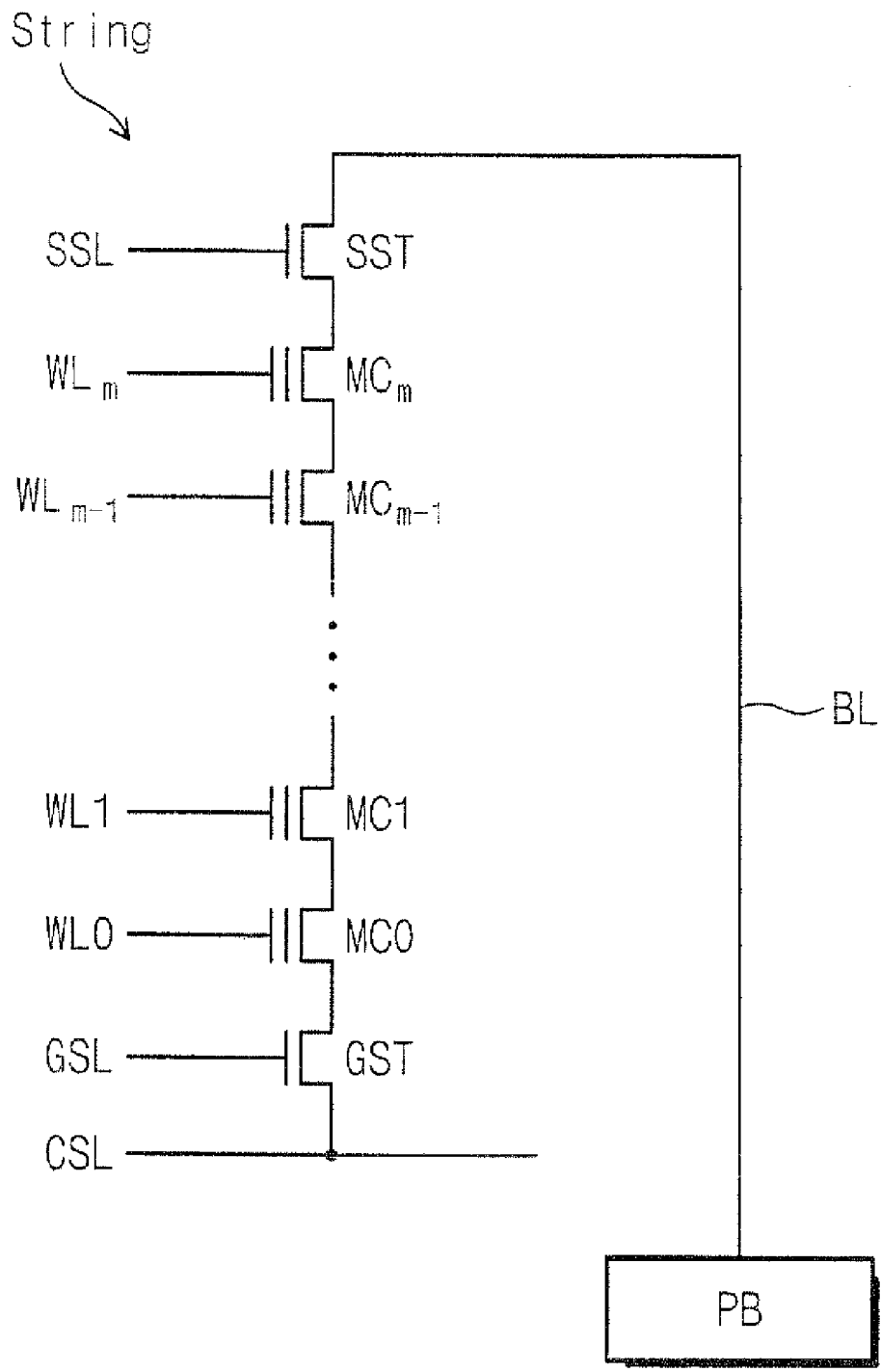
FIG. 1 illustrates an array of a typical non-volatile memory device.
Figure 2:
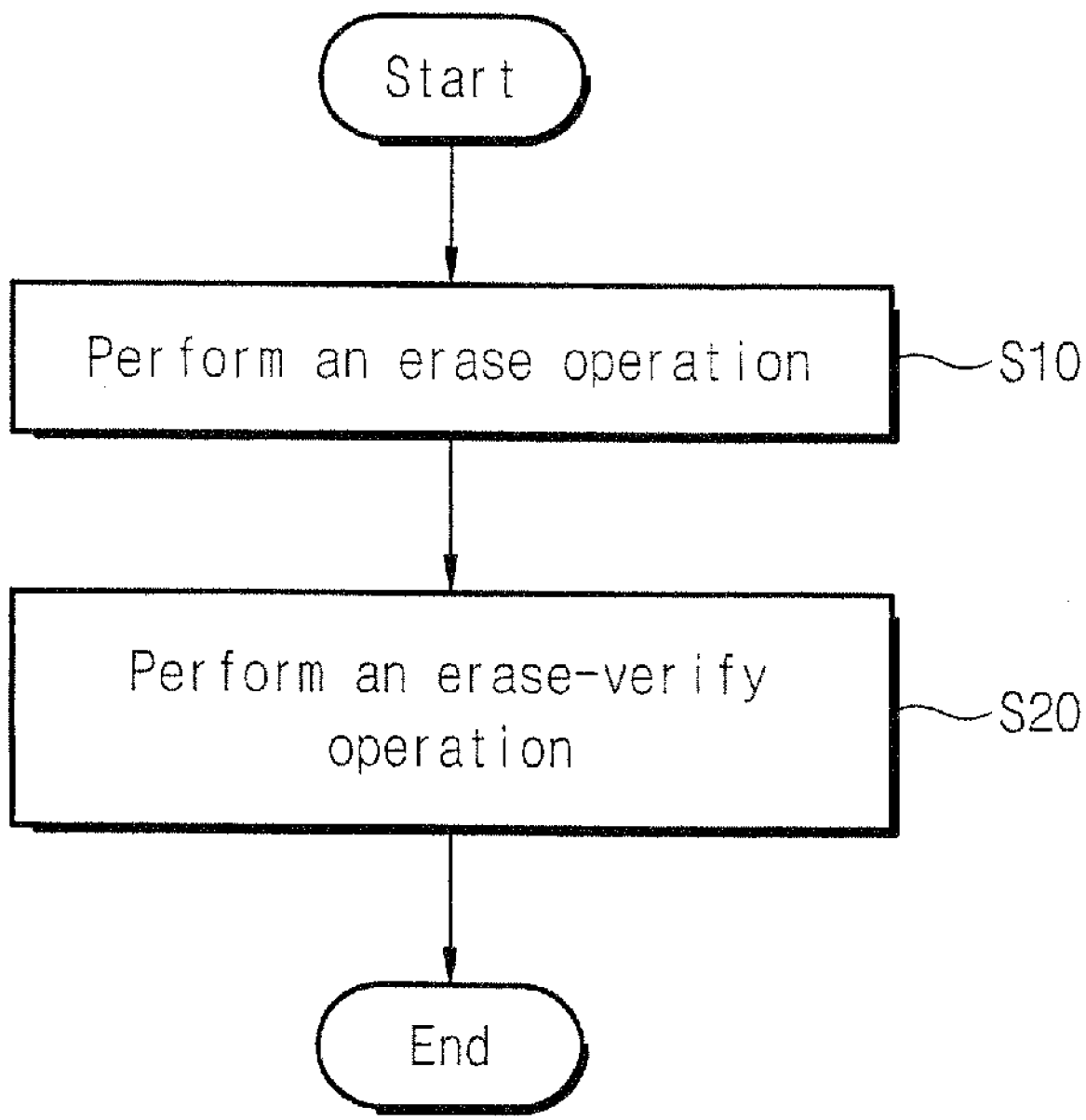
FIG. 2 is a flowchart showing an erase procedure of a conventional non-volatile memory device.
Figure 3:
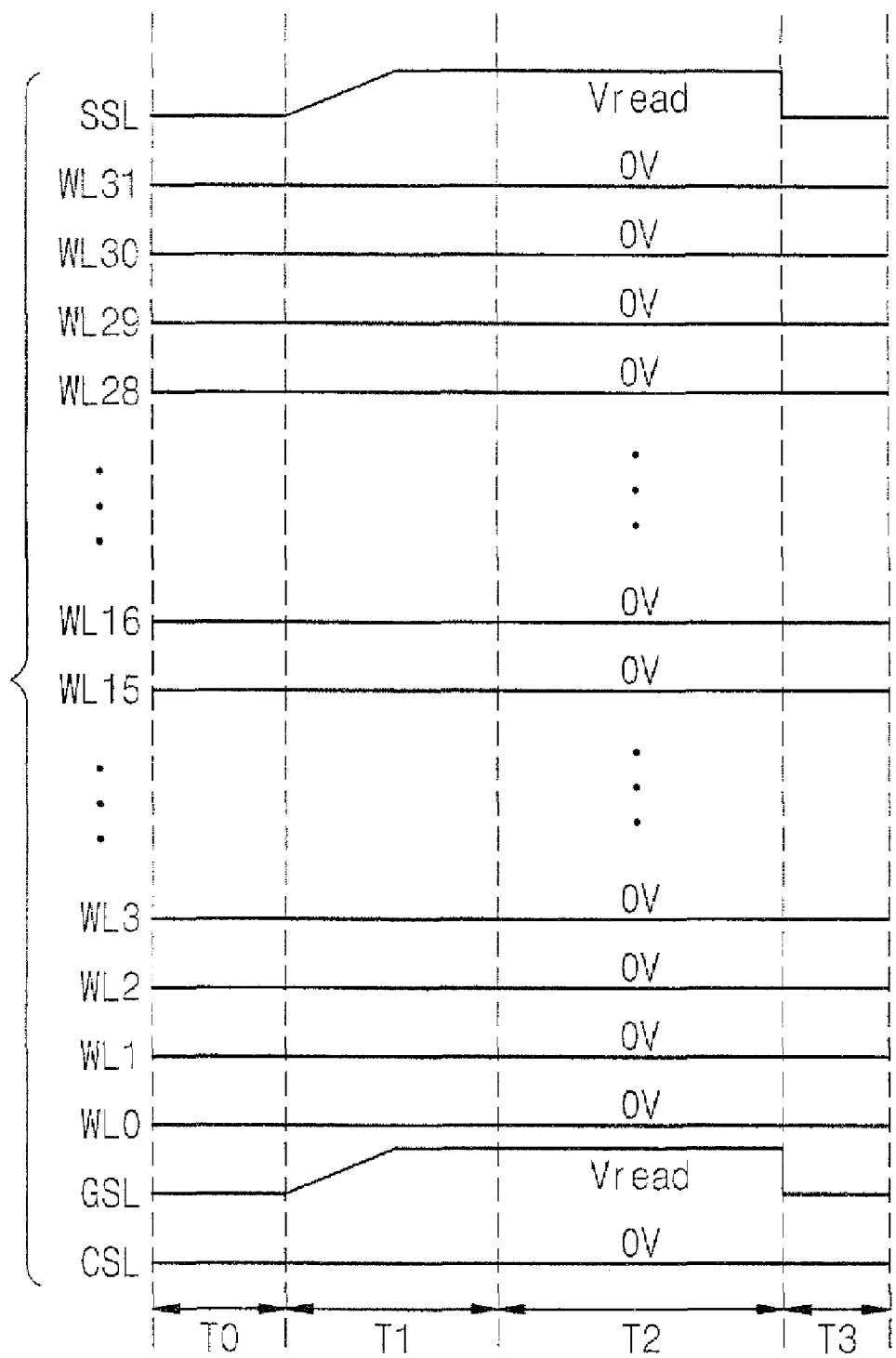
FIG. 3 is a timing diagram for explaining an erase-verify operation of a conventional non-volatile memory device.
Figure 4:
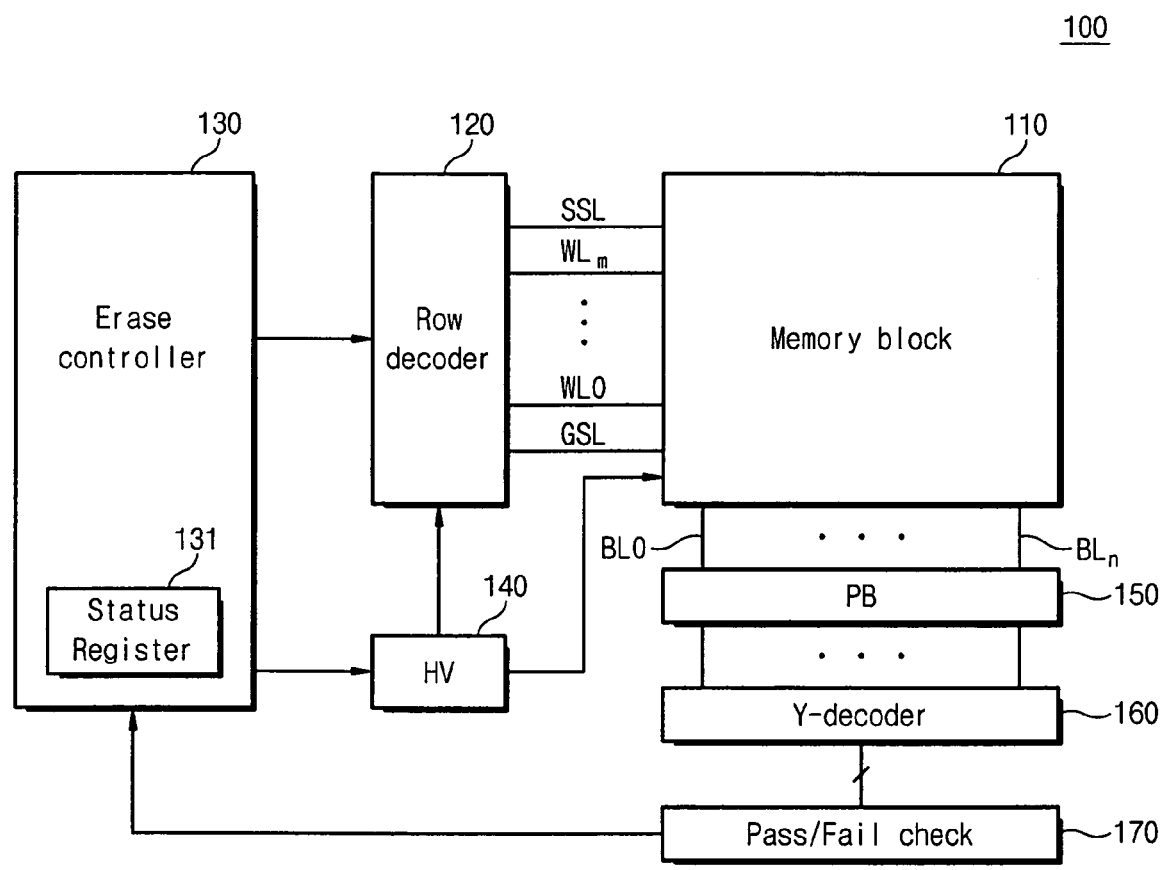
FIG. 4 is a block diagram of a non-volatile memory device according to an embodiment of the invention.

A non-volatile memory device 100 according to the invention is schematically illustrated in FIG. 4. The non-volatile memory device 100 includes a memory block 110 as a memory cell array. The memory block 110 has cell strings of the same configuration as shown in FIG. 1. A row decoder circuit 120 controls activation of a string select line SSL, wordlines WL0-WLm, and a ground select line GSL, according to the control of an erase controller 130. For example, during a first erase-verify operation of any erase cycle, the erase controller 130 controls the row decoder circuit 120 to apply a first read voltage (e.g., 0V) to a part of the wordlines (first wordlines) and to apply a second read voltage (e.g., 5V) to the other wordlines (second wordlines). At this time, the erase controller 130 controls the row decoder circuit 120 to apply the second read voltage to the string and ground select lines SSL and GSL. During a second erase-verify operation of any erase cycle, the erase controller 130 controls the row decoder circuit 120 to a first read voltage (e.g., 0V) to second wordlines and to apply a second read operation (e.g., 5V) to first wordlines. The second read operation would be supplied from a high voltage generator circuit 140 under the control of the erase controller 130.

During respective erase-verify operations of any erase cycle, the page buffer circuit 150 supplies sensing current to respective bitlines BL0-BLn and senses voltage fluctuation of the bitlines BL0-BLn. A page buffer circuit 150 latches sensed values. During the respective erase-verify operations, a column decoder circuit 160 sequentially transmits the latched values to a pass/fail check circuit 170. In this case, a unit of the transmitted values is a bit or larger. The check result, which is obtained by the pass/fail check circuit 170 during the respective erase-verify operations of any erase cycle, is output to the erase controller 130. The erase controller 130 determines whether the next erase cycle is carried out, depending on check results transmitted from the pass/fail check circuit 170. A result value of the erase procedure is output externally using a conventional state read operation.

It is apparent to those skilled in the art that a pass/fail judging method is not limited to the above. For example, the non-volatile memory device 100 according to the invention may be constructed so that latched values of the page buffer circuit 150 are simultaneously transmitted to a pass/fail check circuit. Such a method is disclosed in U.S. Pat. No. 5,299,162 entitled "NONVOLATILE SEMICONDUCTOR MEMORY DEVICE AND OPTIMIZING PROGRAMMING METHOD THEREOF"; and U.S. Pat. No. 6,282,121 entitled "FLASH MEMORY DEVICE WITH PROGRAM STATUS DETECTION CIRCUITRY AND THE METHOD THEREOF", which are incorporated herein by reference.

Figure 5:
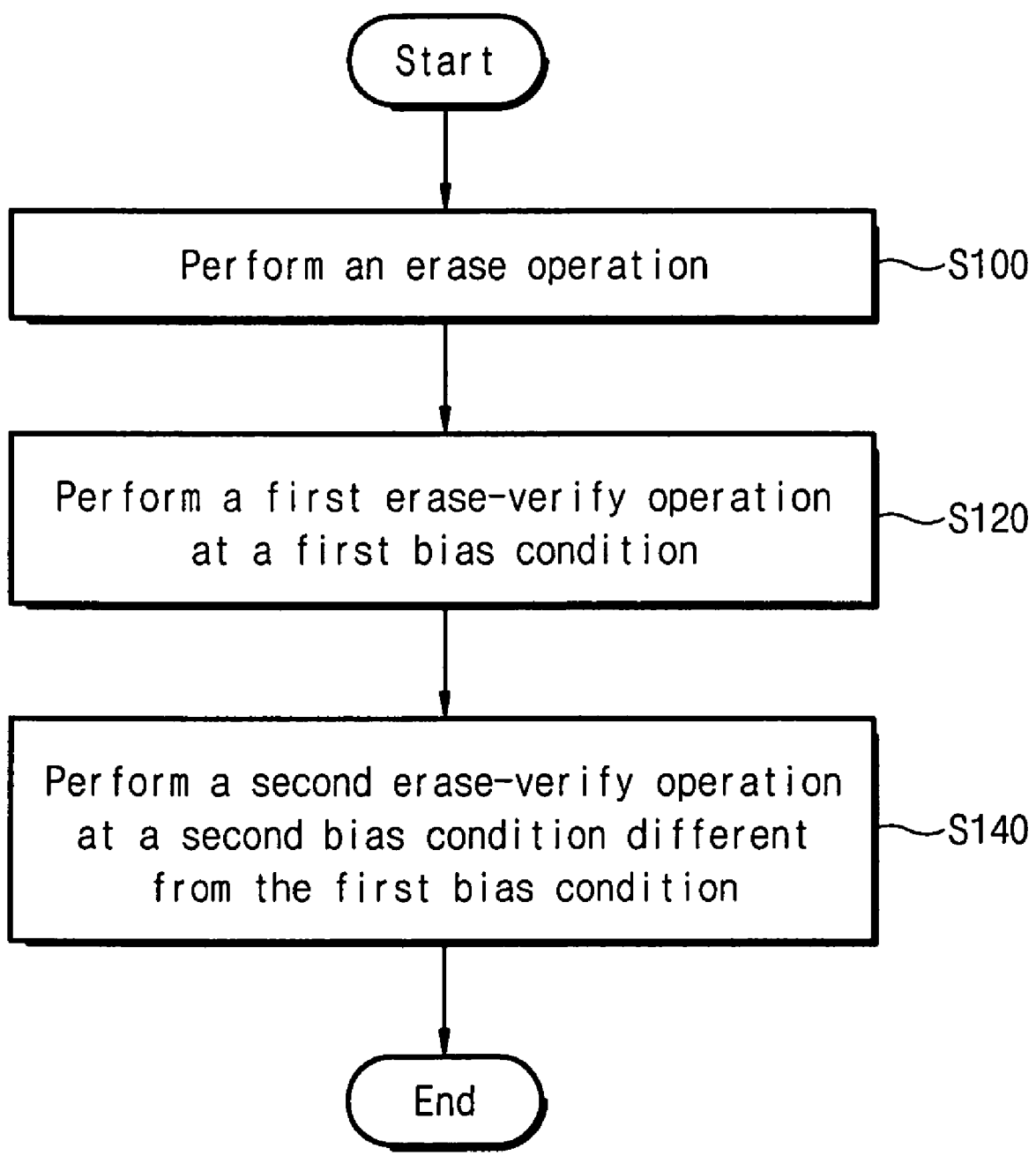
FIG. 5 is a flowchart showing an erase procedure of the non-volatile memory device according to an embodiment of the invention.

Referring to FIG. 5, an erase procedure of the non-volatile memory device according to the invention includes performing an erase operation (S100), performing a first erase-verify operation (S120), and performing a second erase-verify operation (S140). In step S100, an erase operation is performed using the same manner as described above. In step S120, a first erase verify operation is performed under a first bias condition. According to the first bias condition, a first read voltage (e.g., 0V) is applied to a part of the wordlines connected to the memory cells of a cell string (hereinafter referred to as "first wordlines") while a second read voltage (e.g., 5V) higher than the first read voltage is applied to the other wordlines (hereinafter referred to as "second wordlines"). At this time, a second read voltage is applied to a string select line SSL and a ground select line GSL. A first sensing operation is performed under such a bias condition, which will be described in later detail. In step S140, a second erase-verify operation is performed under a second bias condition. According to the second bias condition, a first read operation is applied to second wordlines while a second read operation is applied to first wordlines. A second sensing operation is performed under such a bias condition, which will be described in detail later. That is, an erase-verify operation according to the invention is iteratively performed under different bias conditions of wordlines.

The steps S100, S120, and S140 constitute an erase cycle, and the erase procedure includes a number of erase cycles. The erase step S100, the first erase-verify step S120, and the second erase-verify step S140 are repeated within the number of determined erase cycles until all memory cells are sufficiently erased. Depending on judged results of first and second erase-verify operations, it is determined whether an erase operation is successfully performed.

Figure 6:
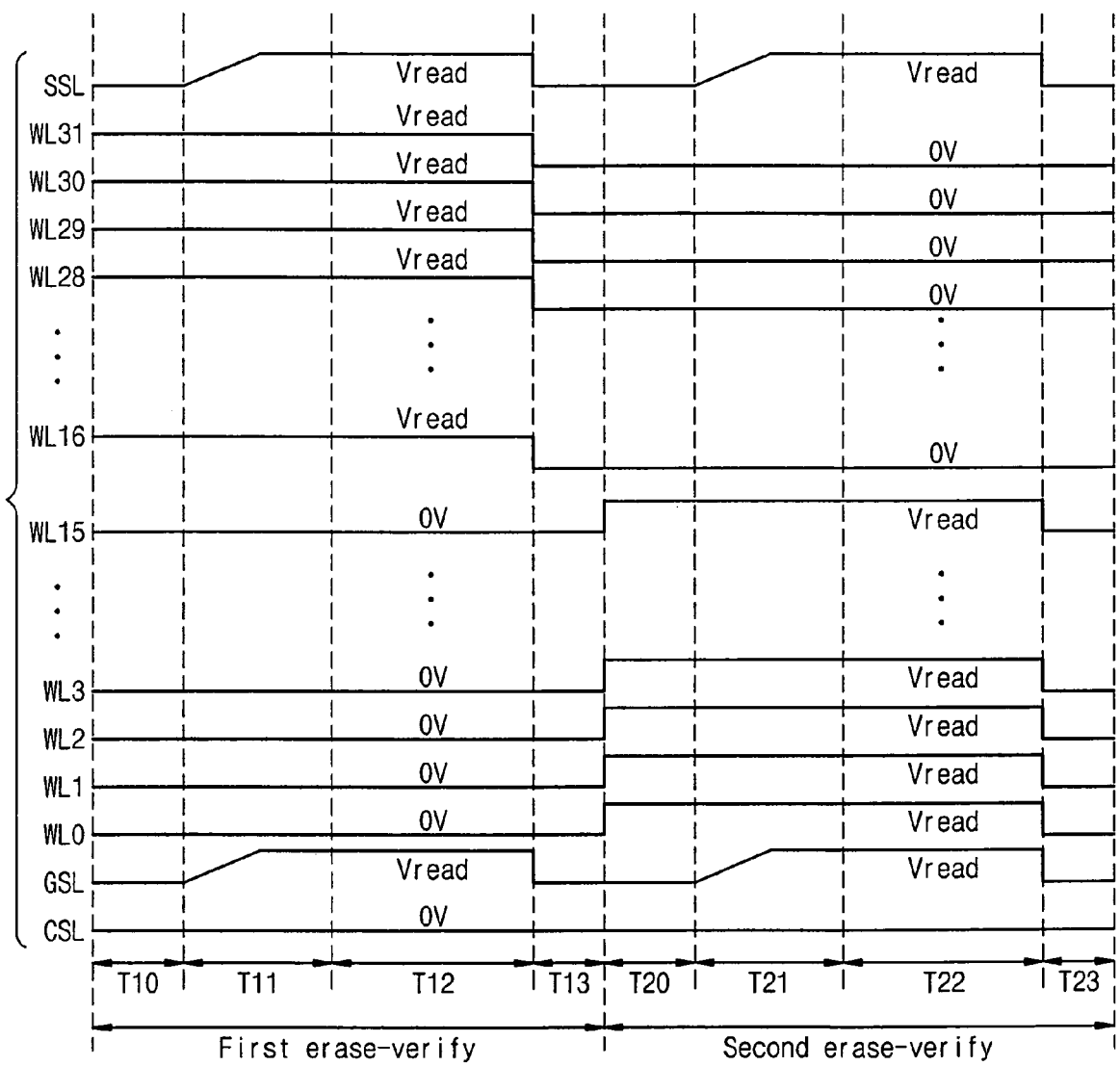
FIG. 6 is a timing diagram for explaining an erase-verify operation of the non-volatile memory device according to an embodiment of the invention.

FIG. 6 is a timing diagram for explaining an erase-verify operation of the non-volatile memory device according to the invention. An erase verify operation according to the invention will now be described more fully hereinafter. Assume that a memory block has 32 wordlines WL0-WL31. As previously stated, an erase operation is followed by an erase-verify operation. For example, memory cells are erased by applying a voltage of 0V to wordlines WL0-WL31 and applying a high voltage (e.g., 20V) to a substrate (or bulk). That is, in respective cell strings, electrons of floating gates of memory cell transistors are emitted to a substrate, which makes a threshold voltage of respective cell transistors drop to an erase threshold voltage of $-1V\sim-3V$. After the erase operation is performed, an erase verify operation is performed to judge whether threshold voltages of erased memory cells reach an erase threshold voltage (or are lower than the erase threshold voltage). Unlike a conventional art, according to the erase procedure of an embodiment, at least two erase-verify operations (hereinafter referred to as "first and second erase-verify operations") are successively performed under different bias conditions of wordlines. Each of the first and second erase-verify operations includes a bitline discharge period, a bitline precharge period, a sense period, and a recovery period.

In a bitline discharge period T10 of a first erase-verify operation, voltages of bitlines are discharged to a ground voltage. Bitlines are connected to corresponding page buffers, respectively. Voltages of the bitlines are discharged by corresponding page buffers. In a precharge period T11 of the first erase-verify operation, bitlines are precharged through corresponding page buffers. In a sense period T12 of the first erase-verify operation, it is sensed whether current flows through respective cell strings. That is, in the sense period T12, a judging operation is performed to judge whether memory cells constituting the respective cell strings are sufficiently erased.

For example, during the first erase-verify operation, a first read voltage (e.g., 0V) is applied to first wordlines WL0-WL15 (or a first group of wordlines) and a second read voltage (e.g., 5V; hereinafter denoted as "Vread") is applied to second wordlines WL16-WL31 (or a second group of wordlines), as illustrated in FIG. 6. At the same time, a read voltage Vread is applied to a string select line SSL and a ground select line GSL. Under such a bias condition, memory cells connected to the second wordlines WL16-WL31 act as on-cells irrespective of their states (erased or programmed state). That is, the memory cells connected to the second wordlines WL16-WL31 have a turn-on state during activation of wordlines. As a result, current flows through respective memory cells without restriction. On the other hand, memory cells connected to the first wordlines WL0-WL15 act as on-cells (sufficiently erased memory cells) or off-cells (insufficiently erased memory cells) according to their states. Sensing current is supplied to bitlines connected to cell strings from corresponding page buffers.

Under such a bias condition, when a threshold voltage of memory cells connected to the first wordlines WL0-WL15 reach or are lower than an erase threshold voltage, sensing current supplied to bitlines is discharged to a common source line CSL through a cell string. That is, a voltage of a bitline drops. When at least one of the threshold voltages connected to the first wordlines WL0-WL15 is higher than an erase threshold voltage, sensing current supplied to a corresponding bitline is not discharged to a common source line CSL through a cell string. That is, a voltage of a bitline rises. Page buffers sense voltage fluctuation of bitlines. In case of the former, data '1' is latched to a page buffer, indicating that memory cells (connected to first wordlines) of a corresponding cell string are sufficiently erased. In case of the latter, data '0' is latched to a page buffer, indicating that memory cells (connected to first wordlines) of a corresponding cell string are insufficiently erased. A sensing result of a first erase-verify operation (i.e., latch values corresponding to cell strings of a memory block) is transmitted to a pass/fail check circuit 170 through a column decoder circuit 160. The pass/fail check circuit 170 outputs a judged result of the first erase-verify operation to an erase controller 130. In the recovery period T13 of the first erase-verify operation, voltages of wordlines, bitlines, and select lines are initialized to 0V.

A bitline discharge period T20, a bitline precharge period T21, a sense period T22, and a recover period T23 of the second erase-verify operation are identical to the periods of the first erase-verify operation, except the following, and will not be described in further detail.

In the sense operation T22 of the second erase-verify operation, a first read voltage (e.g., 0V) is applied to second wordlines WL16-WL31 (or a second group of wordlines) and a second read voltage (e.g., 5V; hereinafter denoted as "Vread") is applied to first wordlines WL0-WL15 (or a first group of wordlines), as illustrated in FIG. 6. At the same time, a read voltage Vread is applied to a string select line SSL and a ground select line GSL. According to such a second bias condition, memory cells connected to the first wordlines WL0-WL15 act as on-cells irrespective of their states (erased state or programmed state). That is, the memory cells connected to the first wordlines WL0-WL15 have a turn-on state. As a result, current flows through respective memory cells without restriction. On the other hand, memory cells connected to the second wordlines WL16-WL31 act as on-cells (sufficiently erased memory cells) or off-cells (insufficiently erased memory cells) according to their states. Sensing current is supplied to bitlines connected to cell strings from corresponding page buffers.

Under such a bias condition, when a threshold voltage of memory cells connected to the second wordlines WL16-WL31 reach or are lower than an erase threshold voltage, sensing current supplied to bitlines is discharged to a common source line CSL through a cell string. That is, a voltage of a bitline drops. When at least one of the threshold voltages connected to the second wordlines WL16-WL31 is higher than an erase threshold voltage, sensing current supplied to a corresponding bitline is not discharged to a common source line CSL through a cell string. That is, a voltage of a bitline rises. Page buffers sense voltage fluctuation of bitlines. In case of the former, data '1' is latched to a page buffer, indicating that memory cells (connected to second wordlines) of a corresponding cell string are sufficiently erased. In case of the latter, data '0' is latched to a page buffer, indicating that memory cells (connected to second wordlines) of a corresponding cell string are insufficiently erased. A sensing result of a second erase-verify operation (i.e., latch values corresponding to cell strings of a memory block) is transmitted to a pass/fail check circuit 170 through a column decoder circuit 160. The pass/fail check circuit 170 outputs a judged result of the first erase-verify operation to an erase controller 130. In the recovery period T23 of the first erase-verify operation, voltages of wordlines, bitlines, and select lines are initialized to 0V.

The erase controller 130 of the non-volatile memory device according to the invention determines whether an erase procedure is continuously performed or pauses, depending on judged results of the first and second erase-verify operations. For example, when the judging results of the first and second erase-verify operations all indicate "erase pass", the erase controller 130 stores a state value indicating that an erase procedure is successfully performed for a status register 131. If one of the judging results indicates "erase failure", the erase procedure is repeated within the number of determined erase cycles based on control of the erase controller 130. A value stored in the status register 131 is output externally by a status read operation.

A status read operation is performed to check a pass/fail result of a program/erase operation without separately reading states of memory cells after the program/erase operation is completed. Such a status read operation is disclosed in a data book of Samsung Electronics Co. Ltd., entitled "(NAND) FLASH MEMORY & Smart Media DATABOOK", released in September, 2003 and U.S. Pat. No. 5,361,227 entitled "NON-VOLATILE SEMICONDUCTOR MEMORY DEVICE AND MEMORY SYSTEM USING THE SAME", which are incorporated herein by reference.

Although an erase operation includes two erase-verify operations, it is apparent to those skilled in the art that the erase operation may include at least three erase-verify operations. Even in this case, it will be understood that the erase-verify operation is performed under the same condition (a voltage of 0V is applied to a part of the wordlines, and a read voltage Vread is applied to the other wordlines) as described above. Additionally, the number of the 0V-applied wordlines may be set to be equal to that of the Vread-applied wordlines. Nevertheless, it is apparent to those skilled in the art that the number of the 0V-applied wordlines may be set to be different from that of the Vread-applied wordlines. Moreover, it will be understood that the number of wordlines of a memory block is not limited to the foregoing disclosure. For example, a memory block may include more or less than 8, 16 or 32 wordlines. That is, a cell string may be configured to be serially connected to more or less than 8, 16 or 32 wordlines.

Figure 7:
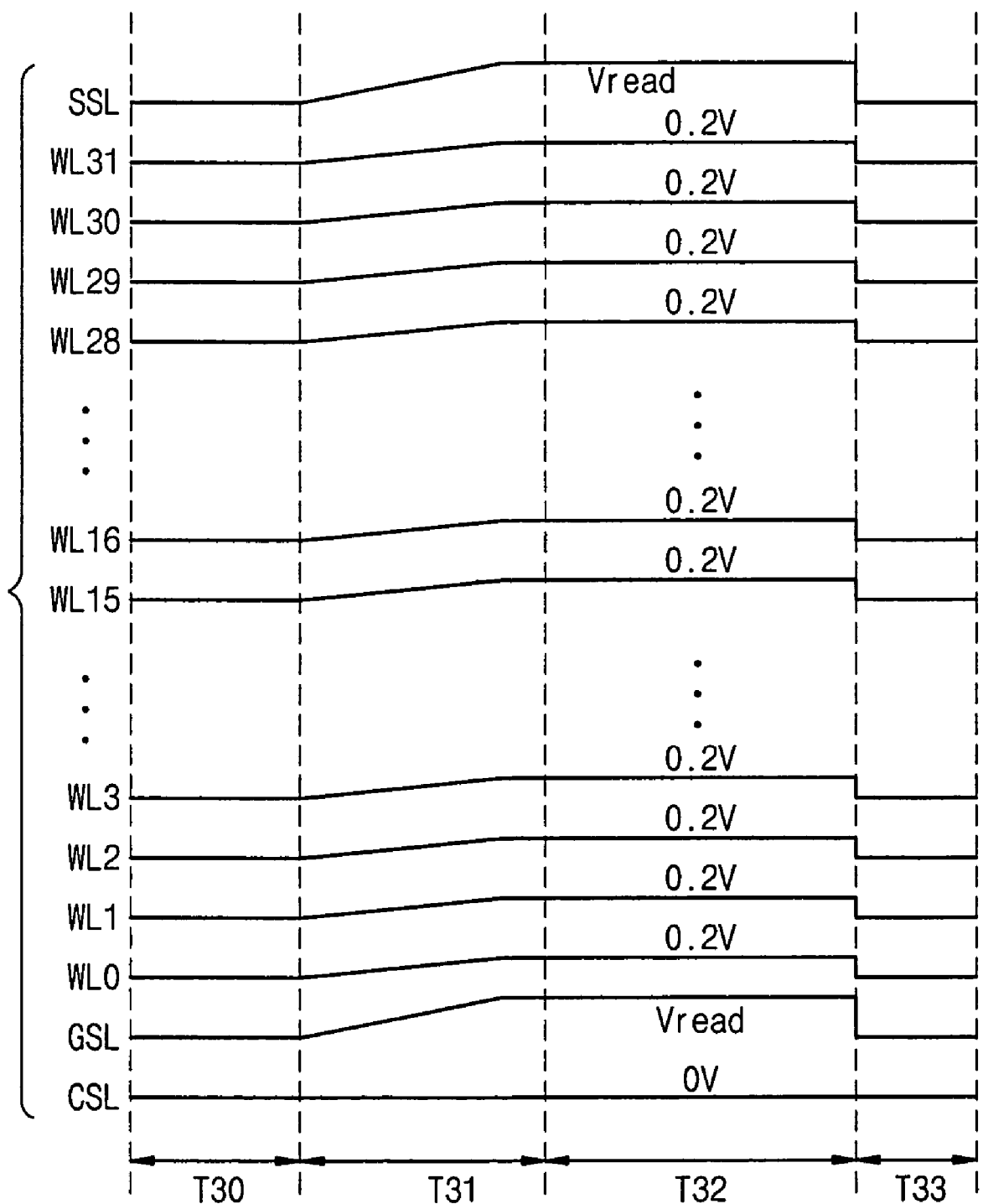
FIG. 7 is a timing diagram for explaining another erase-verify operation of the non-volatile memory device according to another embodiment of the invention.

FIG. 7 is a timing diagram for explaining another erase-verify operation of the non-volatile memory device according to the invention. Referring to FIG. 7, an erase-verify operation includes a bitline discharge period T30, a bitline precharge period T31, a sense period T32, and a recovery period T33. In the bitline discharge period T30, a voltage of a bitline is discharged to a ground voltage through a page buffer. In the bitline precharge period T31, a bitline is precharged to a predetermined voltage through a page buffer. In the sense period T32, it is sensed whether cell current flows through a cell string. In the recovery period T33, voltages of wordlines, bitlines, and select lines are initialized to 0V. In this erase-verify operation according to another embodiment of the invention, a higher voltage (e.g., 0.2V~0.3V) than 0V is applied to all wordlines WL31-WL0 during the sense period T32, as illustrated in FIG. 7. At this time, a read voltage Vread is applied to string and ground select lines, and a common source line CSL is set to a ground voltage. According to such a bias condition, on-cell current flowing through erased memory cells of respective strings increases.

Accordingly, as an operating voltage (or power supply voltage) drops, a specific higher voltage (e.g., 0.2V~0.3V) than 0V is applied to control gates of all memory cells of a cell string (or all wordlines) to overcome a low voltage margin, and to judge a cell judged as an erased cell during a normal read operation as a normally erased cell even during an erase-verify operation.

As explained so far, an erase-verify operation is successively performed twice or more under different bias conditions of wordlines (or erase-verify operations are performed under a condition similar to a normal read operation) to decrease cell current caused by a weak cell which may be produced in a process. Thus, a reliability of an erase-verify operation is enhance to increase a yield.

Although the invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An erase method of a non-volatile memory device including memory cells arranged in a matrix of rows and columns, the erase method comprising:
   erasing the memory cells at the same time; and
   performing an erase-verify operation for the erased memory cells, wherein the erase-verify operation is repeated under different bias conditions of the rows, wherein the erase-verify operation includes a first erase-verify operation and a second erase-verify operation which are sequentially performed, and wherein the first erase-verify operation is performed under a first bias condition in which a first read voltage is applied to a first part of the rows and a second read voltage is applied to another part of the rows.

2. The erase method as recited in claim 1, wherein the second erase-verify operation is performed under a second bias condition in which the second read voltage is applied to the first part of the rows and the first read voltage is applied to the another part of the rows.

3. The erase method as recited in claim 1, wherein the first read voltage is approximately 0V and the second read voltage is approximately 5V.

4. An erase method of a non-volatile memory device including memory cells arranged in a matrix of rows and columns, the erase method comprising:
   erasing the memory cells at the same time; and
   performing an erase-verify operation for the erased memory cells, wherein the erase-verify operation is repeated under different bias conditions of the rows, wherein the erase-verify operation includes a first erase-verify operation and a second erase-verify operation which are sequentially performed,
   wherein the erasing the memory cells and the performing an erase-verify operation are repeated within a number of predetermined erase cycles according to results of the first and the second erase-verify operation.

5. The erase method as recited in claim 4, wherein a combination of the results of the first and the second erase-verify operations is stored as a value in a status register of the non-volatile memory device.

6. The erase method as recited in claim 5, wherein the value is output externally by a state read operation.

7. An erase method of a non-volatile memory device including memory cells arranged in a matrix of rows and columns, the erase method comprising:
   erasing the memory cells at the same time; and
   performing an erase-verify operation for the erased memory cells, wherein the erase-verify operation is repeated under different bias conditions of the rows,
   wherein the non-volatile memory device is a NAND flash memory device.

8. An erase method of a non-volatile memory device including a plurality of cell strings each having a first select transistor connected to a string select line, a second select transistor connected to a ground select line, and memory cells being serially coupled between the first and the second select transistors, and each being connected to corresponding wordlines, the erase method comprising:
   erasing the memory cells at the same time;
   performing a first erase-verify operation while a first read voltage is applied to a part of the wordlines and a second read voltage higher than the first read voltage is applied to another part of the wordlines; and
   performing a second erase-verify operation while the second read voltage is applied to the part of the wordlines and the first read voltage is applied to the another part of the wordlines.

9. The erase method as recited in claim 8, wherein the first read voltage is approximately 0V and the second read voltage is approximately 5V.

10. The erase method as recited in claim 8, wherein the erasing the memory cells, performing a first erase-verify operation, and the performing a second erase-verify operation are repeated within a number of predetermined erase cycles according to results of the first and the second erase-verify operation.

11. The erase method as recited in claim 10, wherein a combination of the results of the first and the second erase-verify operations is stored as a value in a status register of the non-volatile memory device.

12. The erase method as recited in claim 11, wherein the value is output externally by a state read operation.

13. The erase method as recited in claim 8, wherein the second read voltage is applied to the string select line and the ground select line in the performing a first erase-verify operation, and the performing a second erase-verify operation.

14. An erase method of a non-volatile memory device including a plurality of cell strings each having a first select transistor connected to a string select line, a second select transistor connected to a ground select line, and memory cells being serially coupled between the first and the second select transistors, and each being connected to corresponding wordlines, the erase method comprising:

performing a first erase-verify operation while a first read voltage is applied to first ones of the wordlines and a second read voltage higher than the first read voltage is applied to second ones of the wordlines;

performing a second erase-verify operation while the second read voltage is applied to the first ones of the wordlines and the first read voltage is applied to the second ones of the wordlines; and judging an erase operation of the memory cells according to results of the first and the second erase-verify operations.

15. The erase method as recited in claim 14, wherein the first read voltage is approximately 0V and the second read voltage is approximately 5V.

16. The erase method as recited in claim 14, wherein the performing a first erase-verify operation, the performing a second erase-verify operation, and the judging an erase operation are repeated within a number of predetermined erase cycles according to results of the first and the second erase-verify operation.

17. The erase method as recited in claim 16, wherein a combination of the results of the first and the second erase-verify operations is stored as a value in a status register of the non-volatile memory device.

18. The erase method as recited in claim 17, wherein the value is output externally by a state read operation.

19. The erase method as recited in claim 14, wherein the second read voltage is applied to the string select line and the ground select line in the performing a second erase-verify operation, and the judging an erase operation.

20. A non-volatile memory device comprising:
a string select line connected to a string select transistor;
a ground select line connected to a ground select transistor;
wordlines connected to memory cells and divided into at least two groups;
a row decoder circuit configured to control the wordlines and the string select line and the ground select line; and
an erase controller to control the row decoder circuit so that the wordlines of a first group of the wordlines are set to a different bias condition than the wordlines of a second group of the wordlines, in respective first and second erase-verify operations.

21. The non-volatile memory device as recited in claim 20, wherein the first erase-verify operation is performed under a first bias condition in which a first read voltage is applied to the wordlines of the first group of the wordlines and a second read voltage is applied to the wordlines of the second group of the wordlines.

22. The non-volatile memory device as recited in claim 21, wherein the second erase-verify operation is performed under a second bias condition in which the second read voltage is applied to the wordlines of the first group of the wordlines and the first read voltage is applied to the wordlines of the second group of the wordlines.

23. The non-volatile memory device as recited in claim 22, wherein the first read voltage is approximately 0V and the second read voltage is approximately 5V.

24. The non-volatile memory device as recited in claim 22, wherein the erase controller includes a status register in which a combination of results of the first and the second erase-verify operation is stored as a value.

25. The non-volatile memory device as recited in claim 24, wherein the value is output externally by a state read operation.

26. The non-volatile memory device as recited in claim 21, wherein the second read voltage is applied to the string select line and the ground select line in the first and the second erase-verify operations.

27. An erase method of a non-volatile memory device including a plurality of cell strings each having a first select transistor connected to a string select line, a second select transistor connected to a ground select line, and memory cells being connected in series between the first and the second select transistors, and each being connected to corresponding wordlines, the erase method comprising:
applying a first voltage to a gate of the first select transistor;
applying the first voltage to a gate of the second select transistor;
supplying a sensing current to a drain of the first select transistor; and
applying a second voltage higher than 0V to respective control gates of the memory cells.

28. The erase method as recited in claim 27, wherein the first voltage is approximately 5V.

29. The erase method as recited in claim 27, wherein the second voltage is approximately 0.2V~0.3V.

30. An erase method of a non-volatile memory device including memory cells arranged in a matrix of rows and columns, the erase method comprising:
erasing the memory cells at the same time; and
performing an erase-verify operation for the erased memory cells,
wherein a higher voltage than 0V is applied to each of the rows during the erase-verify operation.

31. The erase method as recited in claim 30, wherein a voltage supplied to the rows is approximately 0.2V~0.3V.

* * * * *